(12) United States Patent
Isono

(10) Patent No.: US 7,914,129 B2
(45) Date of Patent: Mar. 29, 2011

(54) PIEZOELECTRIC ACTUATOR AND LIQUID-DROPLET JETTING HEAD

(75) Inventor: Jun Isono, Nagoya (JP)

(73) Assignee: Brother Kogyo Kabushiki Kaisha, Aichi-Ken (JP)

( * ) Notice: Subject to any disclaimer, the term of this patent is extended or adjusted under 35 U.S.C. 154(b) by 967 days.

(21) Appl. No.: 11/810,069

(22) Filed: Jun. 4, 2007

(65) Prior Publication Data

US 2007/0278905 A1 Dec. 6, 2007

(30) Foreign Application Priority Data

Jun. 3, 2006 (JP) ................................. 2006-155484

(51) Int. Cl.
*B41J 2/045* (2006.01)
(52) U.S. Cl. ................ 347/72; 347/20; 347/40; 347/41; 347/47; 347/48; 347/68; 347/71
(58) Field of Classification Search .................. 347/20, 347/40–41, 47–48, 68, 71–72
See application file for complete search history.

(56) References Cited

U.S. PATENT DOCUMENTS

| 6,575,565 B1 * | 6/2003 | Isono et al. ...................... 347/71 |
| 6,595,628 B2 | 7/2003 | Takagi et al. |
| 6,604,817 B2 * | 8/2003 | Isono et al. ...................... 347/71 |
| 6,631,981 B2 * | 10/2003 | Isono et al. ...................... 347/72 |
| 7,073,894 B2 * | 7/2006 | Isono et al. ...................... 347/68 |
| 7,073,895 B2 * | 7/2006 | Ito ...................................... 347/72 |
| 7,163,280 B2 * | 1/2007 | Watanabe ......................... 347/68 |
| 7,294,952 B2 * | 11/2007 | Ito ................................... 310/364 |
| 7,607,760 B2 * | 10/2009 | Ito ..................................... 347/68 |
| 7,690,770 B2 * | 4/2010 | Ito ..................................... 347/71 |
| 2004/0160494 A1 * | 8/2004 | Isono et al. ...................... 347/68 |
| 2005/0162484 A1 | 7/2005 | Isono |
| 2005/0248628 A1 | 11/2005 | Isono |

FOREIGN PATENT DOCUMENTS

| JP | 2002-254634 | 9/2002 |
| JP | 2004-243648 | 9/2004 |
| JP | 2006-15539 | 1/2006 |

* cited by examiner

*Primary Examiner* — Ryan Lepisto
*Assistant Examiner* — Guy G Anderson
(74) *Attorney, Agent, or Firm* — Frommer Lawrence & Haug LLP

(57) ABSTRACT

A piezoelectric actuator includes a first ceramic sheet having individual inner-electrodes formed thereon, a second ceramic sheet having a common inner-electrode formed thereon, a third ceramic sheet having individual surface-electrodes formed thereon, and a fourth ceramic sheet having a plurality of connection electrodes connecting the individual surface-electrodes and the individual inner-electrodes respectively. The connection electrodes have first portions, second portions and third portions respectively, the first portions facing the individual surface-electrodes and arranged at a pitch in a row in a row-direction, the second portions facing the individual inner-electrodes and being arranged in the row-direction to be shifted with respect to the first portions by half the pitch respectively; and the third portions connecting the first portions and the second portions respectively. Accordingly, the electrodes can be made compact or arranged highly densely without lowering the conductance between the electrodes.

14 Claims, 11 Drawing Sheets

PIEZOELECTRIC ACTUATOR AND LIQUID-DROPLET JETTING HEAD

CROSS REFERENCE TO RELATED APPLICATION

The present application claims priority from Japanese Patent Application No. 2006-155484 filed on Jun. 3, 2006, the disclosure of which is incorporated herein by reference in its entirety.

BACKGROUND OF THE INVENTION

1. Field of the Invention

The present invention relates to a piezoelectric actuator and a liquid-droplet jetting head.

2. Description of the Related Art

As a conventional ink-jet head, there is known an ink-jet head having a cavity unit which is constructed by stacking a plurality of sheets and which has a plurality of pressure chambers formed and aligned in a plurality of rows therein, and a piezoelectric actuator which has active portions (energy-generating mechanism) corresponding to the pressure chambers respectively and which is joined to the cavity unit. For example, as shown in FIG. 4 of U.S. Patent Application Publication No. US2005/162484A1 and FIG. 4 of U.S. Patent Application Publication No. US2005/248628 (corresponding to FIG. 4 of Japanese Patent Application Laid-open No. 2006-15539), there is known a piezoelectric actuator including a stack-portion in which ceramic sheets each having a pattern of individual electrodes is formed on a surface thereof and ceramic sheets each having a pattern of a common electrode formed on a surface thereof are stacked alternately, and a top ceramic sheet which is arranged above the stack-portion and which has surface electrodes for the individual electrodes and surface electrodes for the common electrode formed on a surface thereof; wherein these ceramic sheets are calcinated to be integrated, and the surface electrodes for the common electrode are formed to be elongated on the surface of the top ceramic sheet.

Further, the piezoelectric actuator described in U.S. Patent Application Publication No US2005/162484A1 and U.S. Patent Application Publication No. US2005/248628, a ceramic sheet having a pattern for connecting the surface electrodes and the individual electrodes is formed thereon is stacked between the ceramic sheets having the surface electrodes are formed and the ceramic sheets having the individual electrodes are formed thereon. In this piezoelectric actuator, through holes penetrating through the ceramic sheets are formed and an electrically conductive material is filled in the through holes, thereby realizing the connection among the individual electrodes and the pattern for connecting the individual electrodes and the surface electrodes.

In such a piezoelectric actuator, when a flexible flat cable is joined to the surface electrodes for the individual electrodes and the pressing force generated upon the joining acts on portions above the cavity-shaped pressure chambers, there is a fear that the ceramic sheet or sheets is/are broken. For this reason, the surface electrodes for the individual electrodes are arranged on partition walls between the pressure chambers so that the pressing force is received by the partition walls between the pressure chambers. The individual electrodes have connection-portions connected to the surface electrodes for the individual electrodes respectively, pressure chamber-portions corresponding to the pressure chambers arranged in rows at an arranging pitch respectively, and bent portions to which the pressure chamber-portions are connected to be shifted by half the arranging pitch.

In the recent years, there is a demand to decrease as much as possible the area of a portion, of each of the electrodes, which does not contribute to the displacement of volume of the pressure chambers, so as to realize a compact piezoelectric actuator or highly integrated electrodes. However, when an attempt is made to omit the bent portions in the individual electrodes to thereby directly connect the pressure chamber-portions corresponding to the pressure chambers and the connection-portions electrically connected to the surface electrodes for the individual electrodes respectively, dimension (size) of areas, at each of which the pressure-chamber-portion and connection-portion are electrically conducted, is extremely narrow because these portions are located to be mutually shifted. On the other hand, when an attempt is made to shorten the bent portions connecting the pressure chamber-portions and the connection-portions, then a bent angle of the bent portions becomes acute or sharp. In this case, it is difficult to print and form short electrodes each having a sharply bent portion with high precision, and there is a fear that any conduction failure occurs in the bent portions.

An object of the present invention is to provide a piezoelectric actuator and a liquid-droplet jetting head which can be made compact or which can realize highly integrated electrodes.

SUMMARY OF THE INVENTION

According to a first aspect of the present invention, there is provided a piezoelectric actuator which is joined to a cavity unit having a plurality of nozzles each of which jets a liquid-droplet of a liquid and a plurality of pressure chambers which correspond to the nozzles respectively and which are arranged in a row at a predetermined pitch in a predetermined row-direction, the piezoelectric actuator including: a plurality of ceramic sheets stacked in a predetermined stacking direction; a plurality of individual inner-electrodes which correspond to the pressure chambers respectively, and which are arranged in a row between the ceramic sheets; a common inner-electrode which is common to the pressure chambers, and which is arranged to face the individual inner-electrodes so that the ceramic sheets are sandwiched between the common inner-electrode and the individual inner-electrodes; a plurality of individual surface-electrodes arranged on a top surface, of the stacked ceramic sheets, opposite to the cavity unit, each of the individual surface-electrodes being arranged in the row-direction to be shifted with respect to one of the pressure chambers by half the predetermined pitch; a common surface-electrode which is formed on the top surface of the stacked ceramic sheets, and which is connected to the common inner-electrode; and a plurality of connection electrodes which are arranged on a ceramic sheet, among the ceramic sheets, between the individual surface-electrodes and the individual inner-electrodes, and which connect the individual surface-electrodes and the individual inner-electrodes respectively, the connection electrodes including first portions, second portions, and third portions respectively, each of the first portions facing one of the individual surface-electrodes in the stacking direction and being connected to one of the individual surface-electrodes, each of the second portions facing one of the individual inner-electrodes in the stacking direction, being connected to one of the individual inner-electrodes, and being arranged in the row-direction to be shifted with respect to one of the first portions by half the pitch, and the third portions connecting the first portions and the second portions respectively.

According to the first aspect of the present invention, the plurality of connection electrodes, connecting the individual surface-electrodes and the individual inner-electrodes respectively, are arranged between the ceramic sheets sandwiched between the individual surface-electrodes and the individual inner-electrodes. Here, each of the connection electrodes has the first portion which faces one of the individual surface-electrodes in the stacking direction and which is connected to the one of the individual surface-electrodes; the second portion which faces one of the individual inner-electrodes in the stacking direction, which is connected to the one of the individual inner-electrodes, and which is arranged in the row-direction to be shifted with respect to the first portion by half the pitch; and the third portion which connects the first portion and the second portion. Accordingly, even when, in each of the individual inner-electrodes, a portion connected to one of the individual surface-electrodes and another portion corresponding to one of the pressure chambers are arranged closely to each other to an extent that does not adversely influence the electrical conduction, it is possible to absorb the shift by half the pitch between the individual surface-electrodes and the individual inner-electrodes by separating, in each of the connection electrodes which do not contribute to the displacement, the first portion connected to one of the individual surface-electrodes and the second portion connected to one of the individual inner-electrodes. Thus, the entire length of each of the individual inner-electrodes can be shortened, which is advantageous for arranging the electrodes highly densely or making the electrodes to be compact.

In the piezoelectric actuator of the present invention, terminals of signal lines, via which a driving signal is inputted, may be connected to the individual surface-electrodes and the common surface-electrode. In this case, since the terminals of the signal lines transmitting the driving signal for driving the piezoelectric actuator are connected to the individual surface-electrodes and the common surface-electrode, it is possible to provide a required electrical wiring on the surface of the outermost layer of the piezoelectric actuator, thereby making the electric wiring to be easy.

In the piezoelectric actuator of the present invention, the plurality of ceramic sheets may include a first ceramic sheet on which the individual inner-electrodes are formed, a second ceramic sheet on which the common inner-electrode is formed, a third ceramic sheet on which the individual surface-electrodes and the common surface-electrode are formed, and a fourth ceramic sheet on which the connection electrodes are formed; through holes may be formed in each of the ceramic sheets at areas sandwiched between the individual inner-electrodes and the second portions of the connection electrodes respectively and at another areas sandwiched between the individual surface-electrodes and the first portions of the connection electrodes respectively; and an electrically conducted material filled in the through holes may connect between the individual inner-electrodes and the second portions of the connection electrodes and between the individual surface-electrodes and the first portions of the connection electrodes respectively.

In this case, since the conductive material is filled in the through holes, the through holes are employed to make it possible to connect the individual surface-electrodes and the individual inner-electrodes via the connection electrodes respectively, thereby improving the reliability in electrical connection.

In the piezoelectric actuator of the present invention, the first portions of the connection electrodes may extend in an orthogonal direction orthogonal to the row-direction; first portions, among the first portions, mutually adjacent in the row-direction may be connected to the individual surface-electrodes at connection positions which are mutually different in the orthogonal direction; and the individual surface-electrodes may be connected to the terminals of the signal lines at positions overlapping with the connection positions respectively.

In this case, the connection positions at which the individual surface-electrodes and the connection electrodes are connected are located in a scattered or non-concentrated manner. Accordingly, there is no shortage in the strength of the ceramic sheet at the connection positions, and/or there is no deformation of the ceramic sheet at the connection portions. Further, since the connection to the terminals of the signal lines is made at the positions, on the individual surface-electrodes, corresponding to the connection positions with the first portions of the individual surface-electrodes, the portions connected to the connection electrodes and the portions connected to the terminals of the signal lines are connected in a direct manner, thereby increasing the reliability of electrical connection. Furthermore, by arranging the connection positions in a dispersing manner, the positions of the terminals are also dispersed, which in turn makes it possible to wire the signal lines between the terminals with a sufficient distance (in a non-tight manner). In other words, the electrodes can be arranged in more integrated manner.

In the piezoelectric actuator of the present invention, the individual surface-electrodes may be arranged in a row parallel to the row-direction and may extend in the orthogonal direction; and joining electrodes may be formed in the individual surface-electrodes respectively at positions each overlapping with one of the connection positions, the joining electrode being connected to the terminals of the signal lines respectively.

In this case, the joining electrodes, via which the individual surface-electrodes are connected to the terminals of the signal lines respectively, are provided at positions each corresponding to the portion, of one of the individual surface-electrodes, connected to the first portions of one of the connection electrodes. Accordingly, the connection between the portions of the individual surface-electrodes connected to the connection electrodes and the terminals of the signal lines can be made in an assured manner.

In the piezoelectric actuator of the present invention, the pressure chambers may be arranged in a plurality of rows in the cavity unit; the individual inner-electrodes may be arranged in a plurality of rows corresponding to the rows of the pressure chambers respectively; the common inner-electrode may face the individual inner-electrodes in the stacking direction and may extend in the row-direction; the connection electrodes may be arranged in a plurality of rows and the individual surface-electrodes may be arranged in a plurality of rows corresponding to the rows of the individual inner-electrodes; and the common surface-electrode may extend, in a same plane with the individual surface-electrodes, along an end portion of the third ceramic sheet which is orthogonal to the row-direction.

In this case, the common surface-electrode extends along the end portion, of the third ceramic sheet, orthogonal to the row direction of the rows of the individual surface-electrodes. Accordingly, it is possible to ensure the connection between the common surface-electrode and the common inner-electrode while connecting the individual surface-electrodes and the individual inner-electrodes assuredly by using the connection-electrodes.

In the piezoelectric actuator of the present invention, a plurality of first through holes and a plurality of second through holes may be formed in each of the first ceramic sheet and the second ceramic sheet; the first through holes and the second through holes may be formed at positions mutually different in a plane orthogonal to the stacking direction; an electrically conductive material may be filled in each of the first and second through holes.

In this case, since the first through holes and the second through holes are formed at mutually different position, namely at positions which do not overlap with each other, it is possible to form, in each of the through holes, an inner conduction-electrode to have a cup-shape. Accordingly, it is possible to make the bottom-portion of each of the cup-shaped inner conduction-electrodes formed in a certain ceramic sheet have a surface-to-surface contact with one of the electrodes formed in a lower layer-ceramic sheet below the certain ceramic sheet. Thus, the electrical conduction can be made assuredly.

According to a second aspect of the present invention, there is provided a liquid-droplet jetting head which jets a liquid-droplet of a liquid, including: a cavity unit having a plurality of nozzles each of which jets the liquid-droplet, and a plurality of pressure chambers which correspond to the nozzles respectively and which are arranged in a row at a predetermined pitch in a predetermined row-direction; and a piezoelectric actuator which is joined to the cavity unit, the piezoelectric actuator including: a first ceramic sheet on which a plurality of individual inner-electrodes are arranged in a row corresponding to the pressure chambers respectively; a second ceramic sheet which is stacked on the first ceramic sheet and on which a common inner-electrode is formed, the common inner-electrode being common to the pressure chambers and facing the individual inner-electrodes; a third ceramic sheet which is stacked on an outermost layer of the stacked first and second ceramic sheets, and on which a plurality of individual surface-electrodes and a common surface-electrode are formed, each of the individual surface-electrodes being arranged in the row-direction to be shifted with respect to one of the pressure chambers by half the predetermined pitch and being connected to one of the individual inner-electrodes, and the common surface-electrode being connected to the common inner-electrode; and a fourth ceramic sheet which is arranged between the third and first ceramic sheets and on which a plurality of connecting electrodes are formed, the connection electrodes including first portions, second portions, and third portions respectively, each of the first portions facing one of the individual surface-electrodes in the stacking direction and being connected to one of the individual surface-electrodes, each of the second portions facing one of the individual inner-electrodes in the stacking direction, being connected to one of the individual inner-electrodes, and being arranged in the row-direction to be shifted with respect to one of the first portions by half the pitch, and the third portions connecting the first portions and the second portions respectively.

According to the second aspect of the present invention, each of the connection electrodes has the first portion which faces one of the individual surface-electrodes in the stacking direction and which is connected to one of the individual surface-electrodes; the second portion which faces one of the individual inner-electrodes in the stacking direction, which is connected to one of the individual inner-electrodes, and which is arranged in the row-direction to be shifted with respect to the first portion by half the pitch; and the third portion which connects the first portion and the second portion. Accordingly, even when, in the individual inner-electrodes, portions connected to the individual surface-electrodes respectively and another portions corresponding to the pressure chambers respectively are arranged closely to each other to an extent that does not adversely influence the electrical conduction, it is possible to absorb the shift by half the pitch between the individual surface-electrodes and the individual inner-electrodes by separating, in each of the connection electrodes which do not contribute to the displacement, the first portion connected to one of the individual surface-electrodes and the second portion connected to one of the individual inner-electrodes. Thus, the entire length of each of the individual inner-electrodes can be shortened, which is advantageous for arranging the electrodes highly densely or making the electrodes to be compact.

DESCRIPTION OF THE PREFERRED EMBODIMENTS

Figure 1:
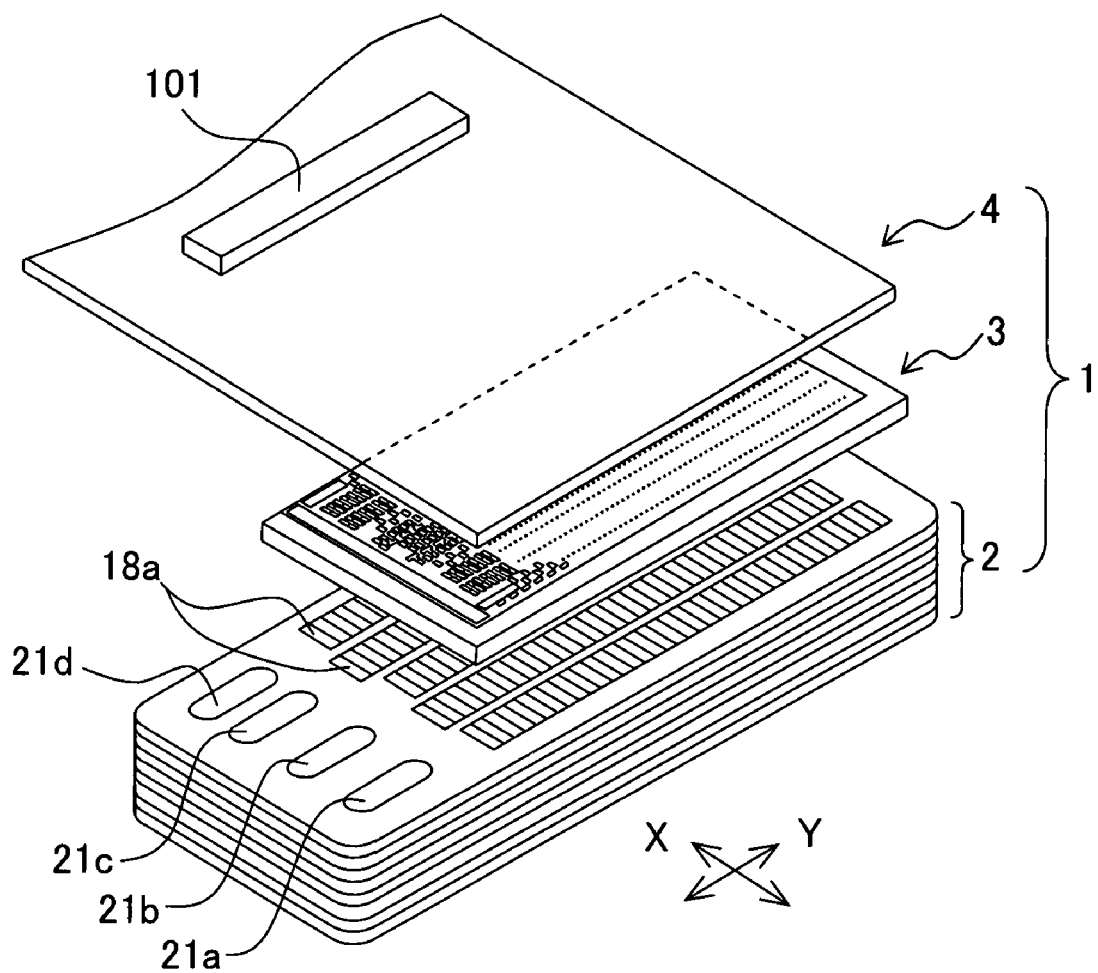
FIG. 1 is an exploded perspective view showing a cavity unit, a piezoelectric actuator and a flat cable of a piezoelectric ink-jet head of the present invention in a state that the cavity unit, the actuator and the flat cable are separated from one another.

In the following, an embodiment of the present invention will be explained with reference to the drawings. Note that an ink-jet head including the piezoelectric actuator according to the embodiment is an ink-jet head for color recording. Although not specifically shown in the drawings, the ink-jet head is provided on a carriage which reciprocates in an X-direction (main scanning direction) which is orthogonal to a Y-direction (sub-scanning direction) as a transport direction of a recording paper. For example, four color inks (cyan, magenta, yellow and black inks) are supplied to the ink-jet head from ink cartridges provided on the carriage or from ink tanks arranged in the body of the printer, via ink supply pipes and damper tanks provided on the carriage.

Figure 2:
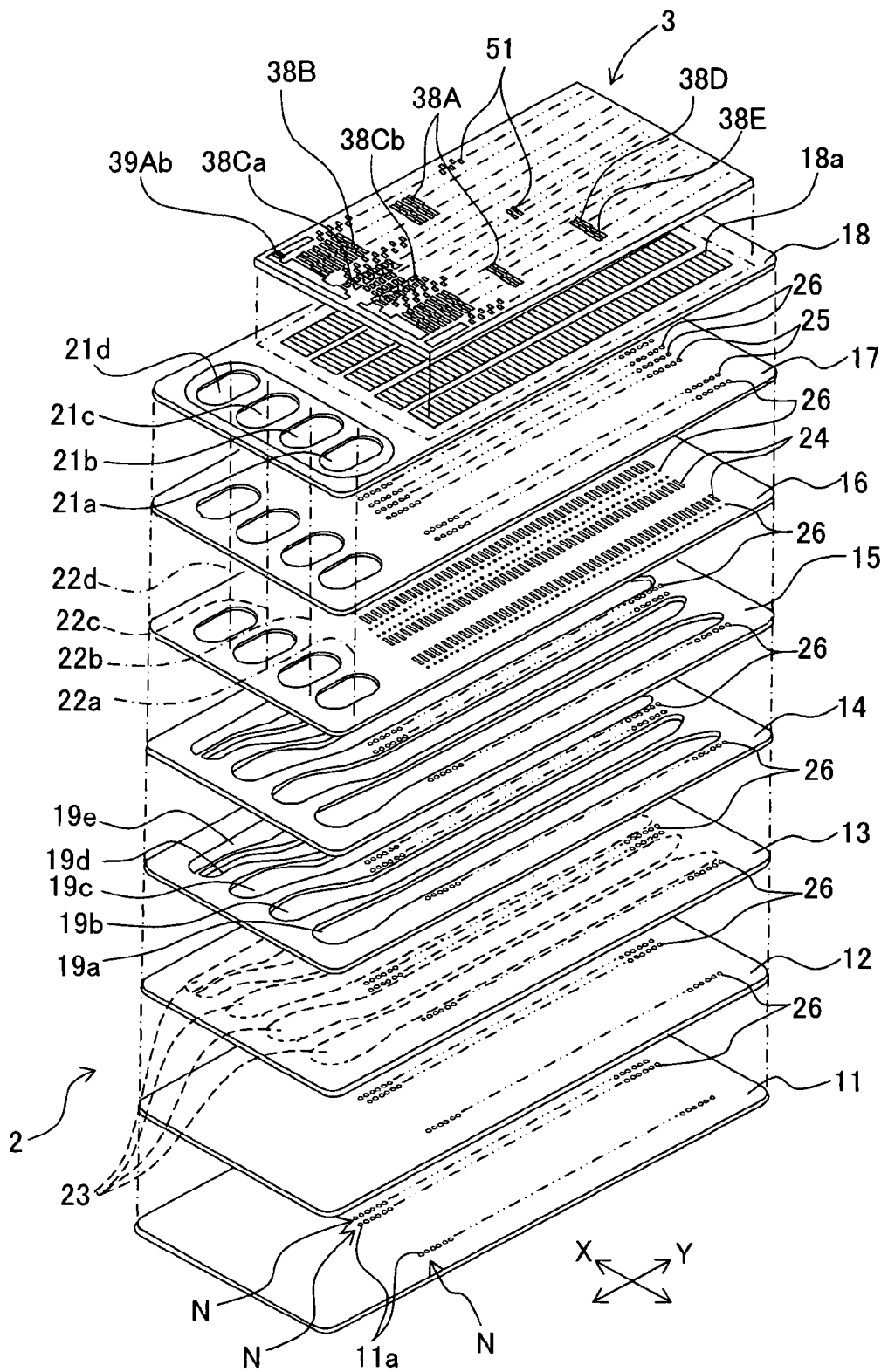
FIG. 2 is an exploded perspective view of the cavity unit.
Figure 3:
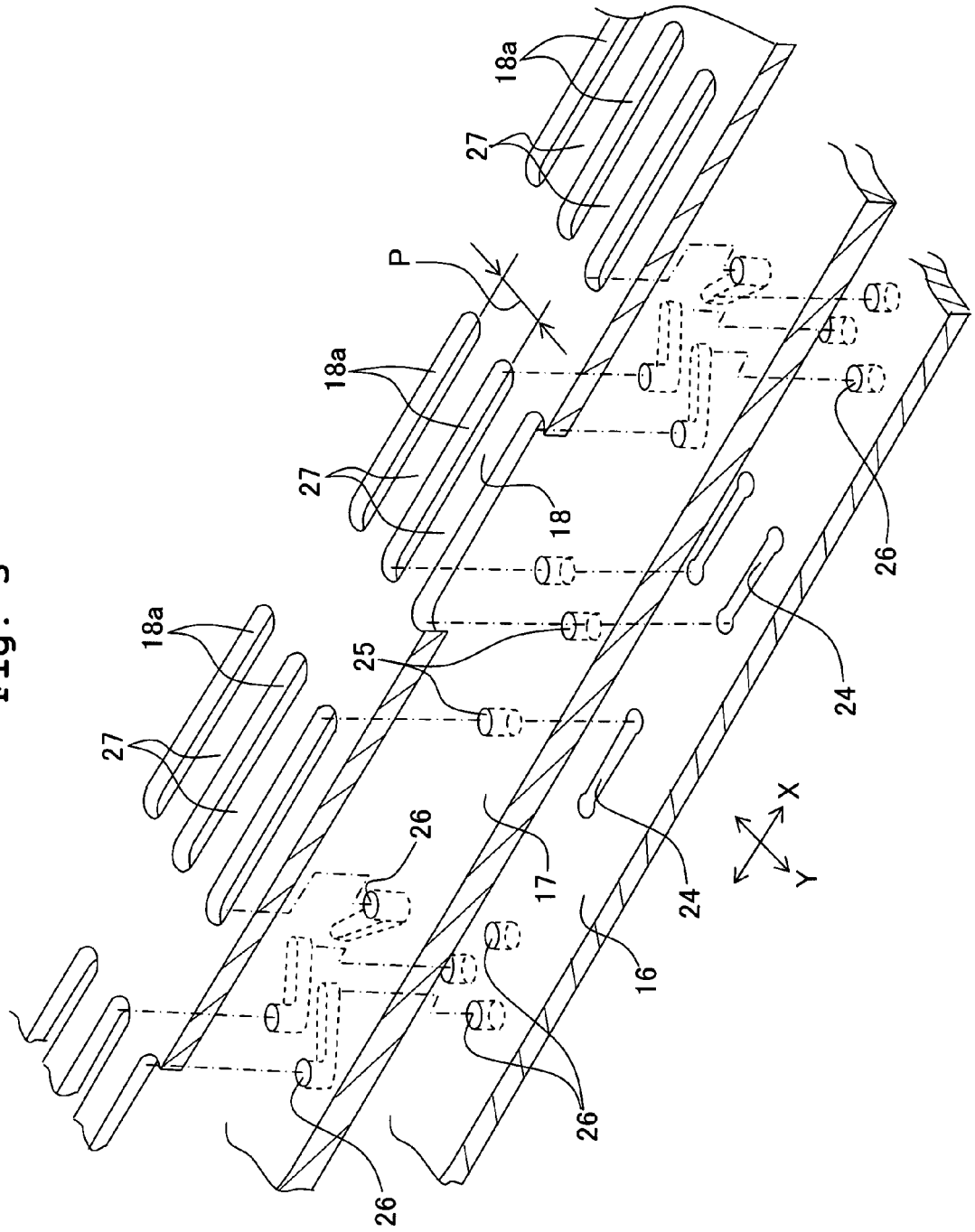
FIG. 3 is an exploded perspective view of a part of the cavity unit.

FIG. 1 is an exploded perspective view showing in which a flexible flat cable is joined to the upper surface of an ink-jet head to which the present invention is applied; FIG. 2 is a perspective view showing the cavity unit and the like; and FIG. 3 is a partial perspective view showing main components of the cavity unit in an enlarged manner.

As shown in FIG. 1, an ink-jet head 1 is provided with a cavity unit 2 having a plurality of pressure chambers formed and arranged in a plurality of rows in the cavity unit 2, and a plate-type piezoelectric actuator 3 which is adhered onto the cavity unit 2. A flexible flat cable 4 via which a driving signal is inputted is joined to the upper surface of the piezoelectric actuator 3. The pressure chambers correspond to a plurality of nozzles which jet liquid droplets, respectively.

The cavity unit 2 is a stacked body (laminated body) in which eight pieces of plates are stacked and adhered onto one another. As shown in FIG. 2, the cavity unit 2 includes, in a order from bottom up, a nozzle plate 11, a cover plate 12, a damper plate 13, a lower manifold plate 14, an upper manifold plate 15, a lower spacer plate 16, an upper spacer plate 17, and a base plate 18 in which pressure chambers 18a are formed. The nozzle plate 11 is made of a synthetic resin material, and the remaining plates 12 to 18 are each made of 42% nickel alloy steel plate. Each of the plates 11 to 18 has a thickness of about 50 μm to 150 μm.

In the nozzle plate 11 forming the lower surface of the cavity unit 2, five nozzle rows N (FIG. 2 shows only three of the nozzle rows N). Each of the nozzle rows N includes a large number of nozzles 11a which are arranged in the Y-direction and which jet the ink. Each of the nozzles 11a has a hole diameter of about 25 μm.

In each of the lower and upper manifold plates 14 and 15, five through holes elongated in the Y-direction are formed to penetrate the plate in the thickness direction thereof, corresponding to the nozzle rows N respectively. The manifold plates 14 and 15 are sandwiched by the lower space plate 16 and the damper plate 13, so that the five through holes form five manifold chambers 19a, 19b, 19c, 19d and 19e (common ink chambers). Note that the manifold chambers 19a, 19b and 19c are for the cyan ink (C), yellow ink (Y) and magenta ink (M) respectively, and the manifold chambers 19d and 19e are for the black ink (BK).

In FIG. 2, four ink supply holes 21a, 21b, 21c and 21d are aligned in a row in the base plate 18 at one end portion in the Y-direction of the base plate 18. The ink supply holes 21a, 21b and 21c supply the inks to the manifold chambers 19a, 19b and 19c respectively; and the ink supply hole 21d supplies the ink to the two manifold chambers 19e and 19d. As shown in FIG. 2, ink supply channel 22a, 22b, 22c and 22d are formed in each of the upper and lower spacer plates 17 and 16 at an end portion thereof. Upstream-side ends of the ink supply channel 22a to 22d are communicated with the ink supply holes 21a to 21d respectively. A downstream-side end of each of the ink supply channel 22a, 22b and 22c is communicated with one end of one of the manifold chambers 19a, 19b and 19c to which the ink supply channel corresponds; and a downstream-side end of the ink supply channel 22d is communicated with one ends of the manifold chambers 19d and 19e.

Further, five recesses are formed in the lower surface of the damper plate 13. The recesses are open downwardly and have shapes corresponding in a plan view to the manifold chambers 19a to 19e, respectively. The openings of the recesses are closed by the cover plate 12 to define damper chambers 23 in a closed state. When the piezoelectric actuator 3 is driven, although pressure wave is propagated to the pressure chambers 18a, a component (backward-moving component) of the pressure wave toward the manifold chambers 19a to 19e is absorbed by the vibration of thin-walled portions of the damper chambers 23, thereby making it possible to prevent the occurrence of so-called crosstalk.

As shown in FIG. 3, throttles 24 are formed in the lower spacer plate 16 corresponding to the nozzles 11a in each of the nozzle rows N respectively. Each of the throttles 24 is a slim recess extending in the X-direction. An end of each of the throttles 24 is communicated with one of the manifold chambers 19a to 19e in the upper manifold plate 15 to which the throttle 24 correspond, and the other end of each of the throttles 24 is communicated, in the upper spacer plate 17, with one of communication holes 25 penetrating through the upper spacer plate 17 in the up and down direction.

Communication channels 26, which are communicated with the nozzles 11a in each of the nozzle rows N, are formed in each of the cover plate 12, damper plate 13, upper and lower manifold plates 14, 15, and lower and upper spacer plates 16, 17 to penetrate through the plate in up and down direction, at positions at which the communication channels 26 do not overlap with any of the manifold chambers 19a to 19e or any of the manifold chambers 23 in the up and down direction.

In the base plate 18, the pressure chambers 18a are formed to be elongated in the X-direction and to penetrate through the base plate 18 in the thickness direction thereof. The pressure chambers 18a correspond to the nozzles 11a respectively, and the pressure chambers 18a are arranged to form rows (pressure-chamber rows) corresponding to the nozzle rows N. One ends in the longitudinal direction of the pressure chambers 18a are communicated with the communication holes 25 in the upper spacer plate 17 respectively; and the other ends in the longitudinal direction of the pressure chambers 18a are communicated with the communication channels 26 which are formed in each of the plates 12 to 17 to penetrate therethrough. As shown in FIG. 3, the pressure chambers 18a in each of the pressure-chamber rows are arranged in the Y-direction at a predetermined pitch P with partition walls 27 being intervened therebetween. A pressure chamber 18 in a certain pressure-chamber row among the pressure-chamber rows is arranged to be shifted by a half the pitch P (P/2) with respect to another pressure chamber 18a belonging to another pressure-chamber row adjacent to the certain pressure-chamber row. Namely, the pressure-chamber rows are arranged in a staggered manner from one another.

Accordingly, the inks, supplied from the ink supply holes 21a to 21d inflow to the manifold chambers 19a to 19e respectively, and then flow through the throttles 24 and the communication holes 25 to be distributed to the pressure chambers 18a. Then, the inks flow through the pressure chambers 18a to the communication channels 26 respectively, then reach to the nozzles 11a corresponding to the pressure chambers 18a respectively, and the inks are jetted as liquid droplets (ink droplets) from the nozzles 11a.

Figure 4:
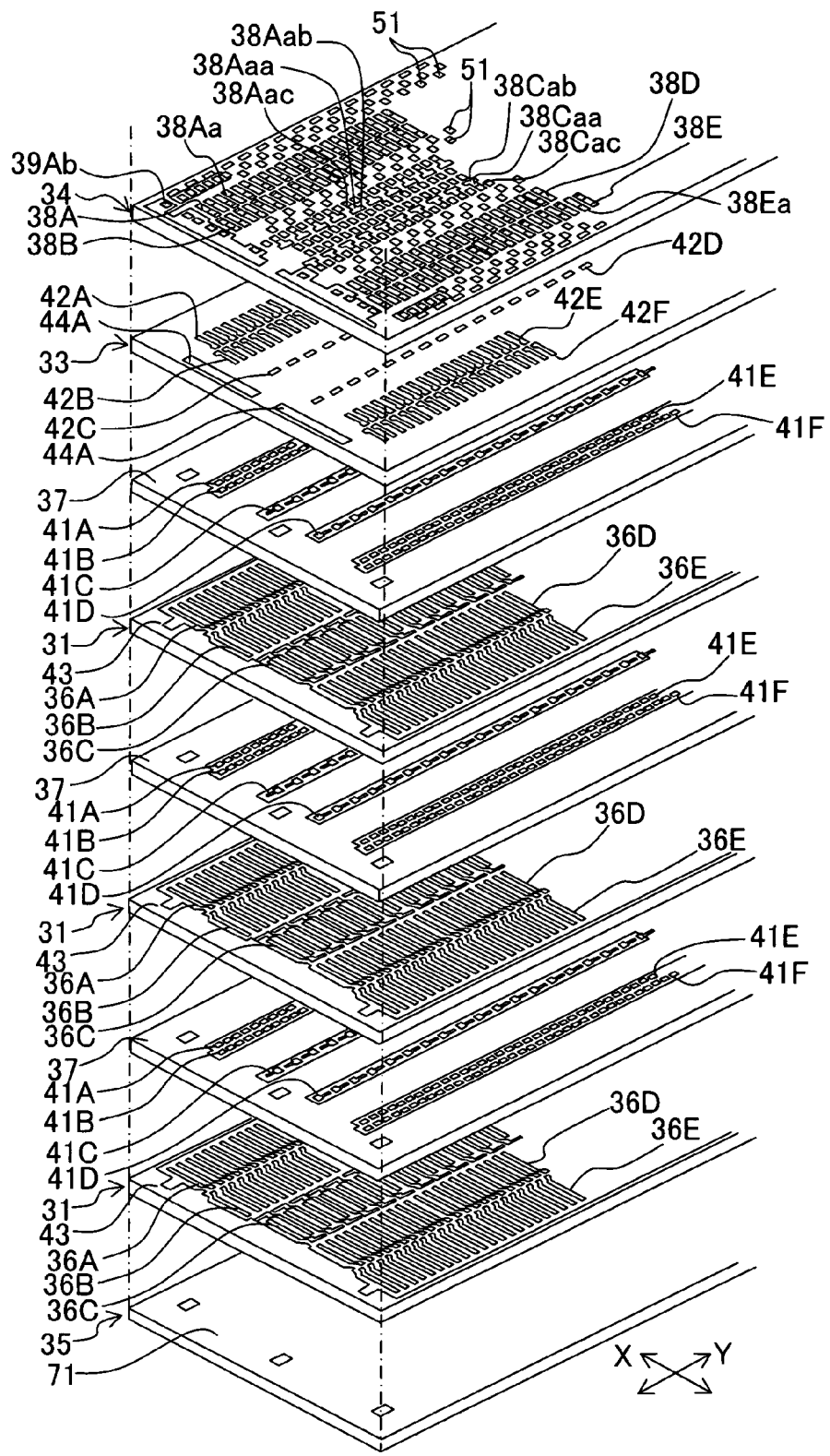
FIG. 4 is an exploded perspective view of the piezoelectric actuator in which a part of the piezoelectric actuator is omitted.

As shown in FIG. 4, the piezoelectric actuator 3 includes three pieces of first ceramic sheets 31 each of which has a pattern of individual inner-electrodes 36A, 36B, 36C, 36D and 36E formed on a surface thereof; three pieces of second ceramic sheets 32 each of which has a pattern of a common inner-electrode 37 formed on a surface thereof; a dummy ceramic sheet 33 for the electric conduction (fourth ceramic sheet; conduction-dummy ceramic sheet 33); a top ceramic sheet (third ceramic sheet) 34 which has individual surface-electrodes 38A, 38B, 38C, 38D and 38E formed on a surface thereof and common surface-electrodes 39A, 39B formed on the surface thereof; and a bottom ceramic sheet 35 having a common inner-electrode 37B formed entirely on a surface thereof. Three pieces of the first ceramic sheets 31 and three pieces of the second ceramic sheets 32 are alternately stacked onto one another; the conduction-dummy ceramic sheet 33 is stacked on the alternately stacked first and second ceramic sheets 31, 32; and the top ceramic sheet 34 is further stacked on the conduction-dummy ceramic sheet 33. Furthermore, the bottom ceramic sheet 35 is stacked, as the lowermost layer, below the stacked portion in which the first and second ceramic sheets 31, 32 are stacked. Here, the conduction-dummy ceramic sheet 33 and the top ceramic sheet 34 function as restricting layers (regulating layers). Namely, when active portions of the first and second ceramic sheets 31 and 32 are displaced as will be described later on, the conduction-dummy ceramic sheet 33 and the top ceramic sheet 34 function to suppress the displacement of the active portions in a direction opposite to the pressure chambers 18a and to direct the displacement of the active portions more to a direction toward the pressure chambers 18a.

These ceramic sheets 31 to 35 are formed as follows. First, green sheets are formed by preparing a mixture liquid of lead zirconate titanate (PZT ($PbTiO_3$—$PbZrO_3$))-based ceramic powder which is ferroelectric, a binder and a solvent, and spreading the mixture liquid to a sheet-like shape, and by performing drying therefor. An electrically conductive material (Ag—Pd based conductive paste) is coated on the green sheets by the screen printing or the like to thereby form the respective electrodes as described above. Then, these green sheets are stacked together and calcinated to be integrated. Afterwards, a high voltage is applied between the individual inner-electrodes and the common inner-electrode to polarize the ceramic sheets at portions thereof sandwiched between the individual inner-electrodes and the common inner-electrode. With this, so-called piezoelectric characteristic (property to be displaced by the application of drive voltage) is imparted to the polarized portions of the ceramic sheets. Note that each of the ceramic sheets 31 to 35 has a thickness of about 30 μm. Further, it is enough that conduction-dummy ceramic sheet 33, the top ceramic sheet 34 and the bottom ceramic sheet 35 have the insulating property. Accordingly, these sheets 33 to 35 may be formed of a material exhibiting no piezoelectric characteristic.

Figure 5:
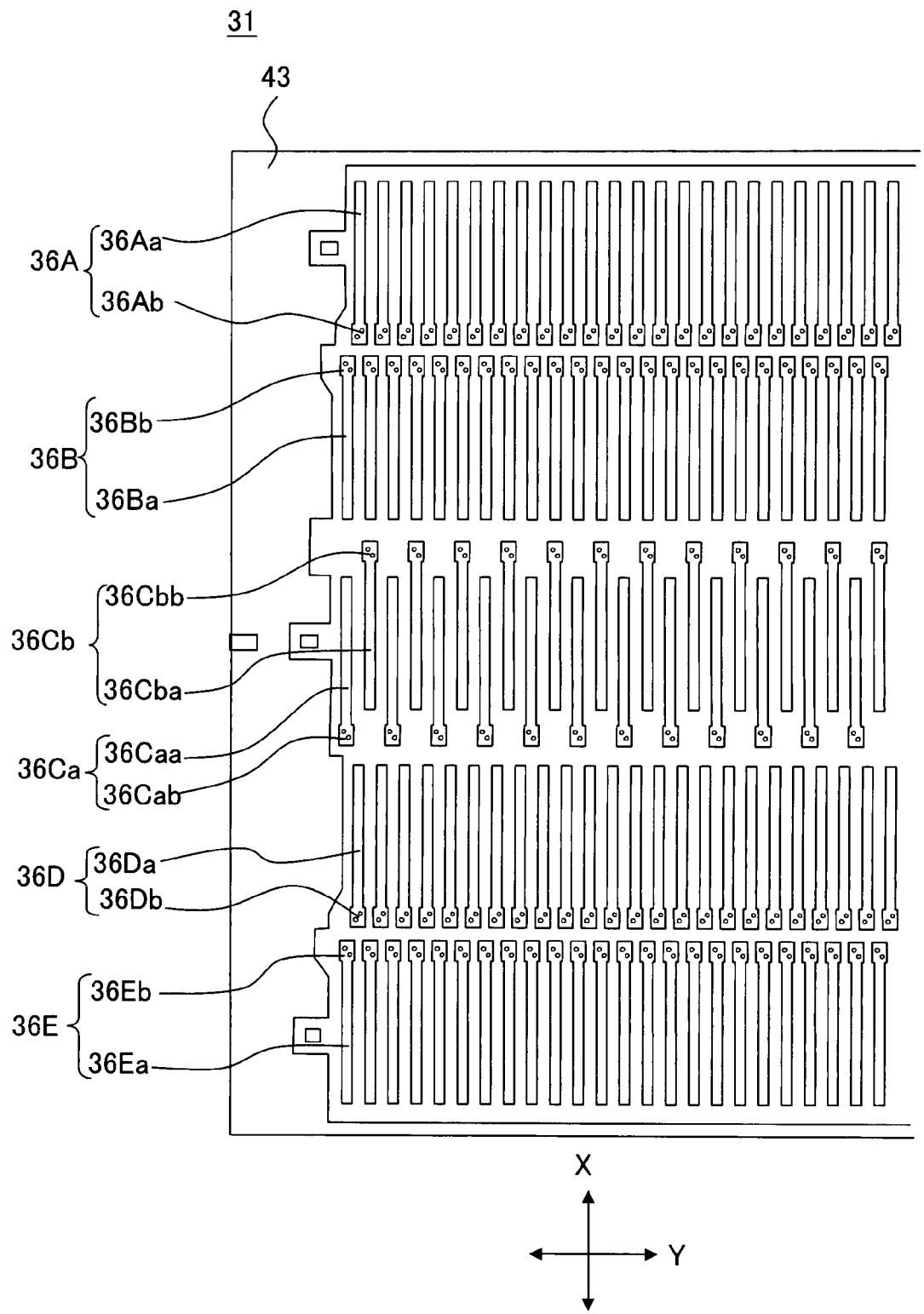
FIG. 5 is a plan view of a first piezoelectric ceramic sheet in which a part of the first piezoelectric ceramic sheet is omitted.

As shown in FIG. 5, on a surface of each of the first ceramic sheets 31, the individual inner-electrodes (first electrodes) 36A to 36E are formed and arranged in five rows corresponding to the pressure chambers 18a arranged in five rows, respectively. The individual inner-electrodes 36A to 36E have linear portions 36Aa to 36Ea extending in a direction, and conduction portions 36Ab to 36Eb having a rectangular shape and extending from one ends of the linear portions 36Aa to 36Ea in the extending direction thereof, respectively. Each of the linear portions 36Aa to 36Ea has an approximately same length as that of one of the pressure chambers 18a and overlaps with one of the pressure chambers 18a in a plan view. Further, each of the linear portions 36Aa to 36Ea has a width slightly narrower than that of one of the pressure chambers 18a.

The individual electrodes 36C arranged in the center in the first ceramic sheet 31 include two kinds of individual electrodes, namely individual electrodes 36Ca and 36Cb. The individual electrodes 36Ca and 36Cb are formed such that the conduction portions 36Cab and 36Cbb extend alternately in mutually opposite directions from one ends of the linear portions 36Caa and 36Cba respectively, the one ends corresponding to outer end portions of the pressure chambers 18a respectively.

The individual inner-electrodes 36B, 36D arranged in rows outside the individual electrodes 36Ca and 36Cb respectively are formed such that the conduction portions 36Bb, 36Db are connected to one ends of the linear portions 36Ba, 36Da respectively, the one ends corresponding to outer end portions of the pressure chambers 18a. The individual inner-electrodes 36A, 36E arranged in rows outside the individual inner-electrodes 36B and 36D respectively are formed such that the conduction portions 36Ab, 36Eb are connected to one ends of the linear portions 36Aa, 36Ea respectively, the one ends corresponding to inner end portions of the pressure chambers 18a.

Further, the conduction portions 36Ab to 36Eb of the individual inner-electrodes 36A to 36E in each of the first ceramic sheets 31 are arranged so that at least a part of each of the conduction portions 36Ab to 36Eb overlap in a plan view with one of conduction electrodes 41A, 41B, 41C, 41D, 41E and 41F arranged in rows in the second ceramic sheets 32 adjacent to the first ceramic sheet 31 in the up and down directions respectively, or with one of connection electrodes 42A, 42B, 42C, 42D, 42E and 42F arranged in rows in the conduction-dummy ceramic sheet 33.

Furthermore, on each of the first ceramic sheets 31, a dummy common electrode 43 is formed at a portion at which a part of the dummy common electrode 43 overlaps in a plan view with the common inner-electrode 37 (first belt-like portions 37A to 37G) in each of the second ceramic sheets 32, the portion being an outer periphery portion located on a surface of the first ceramic sheet 31 along the short and long sides thereof.

Figure 6:
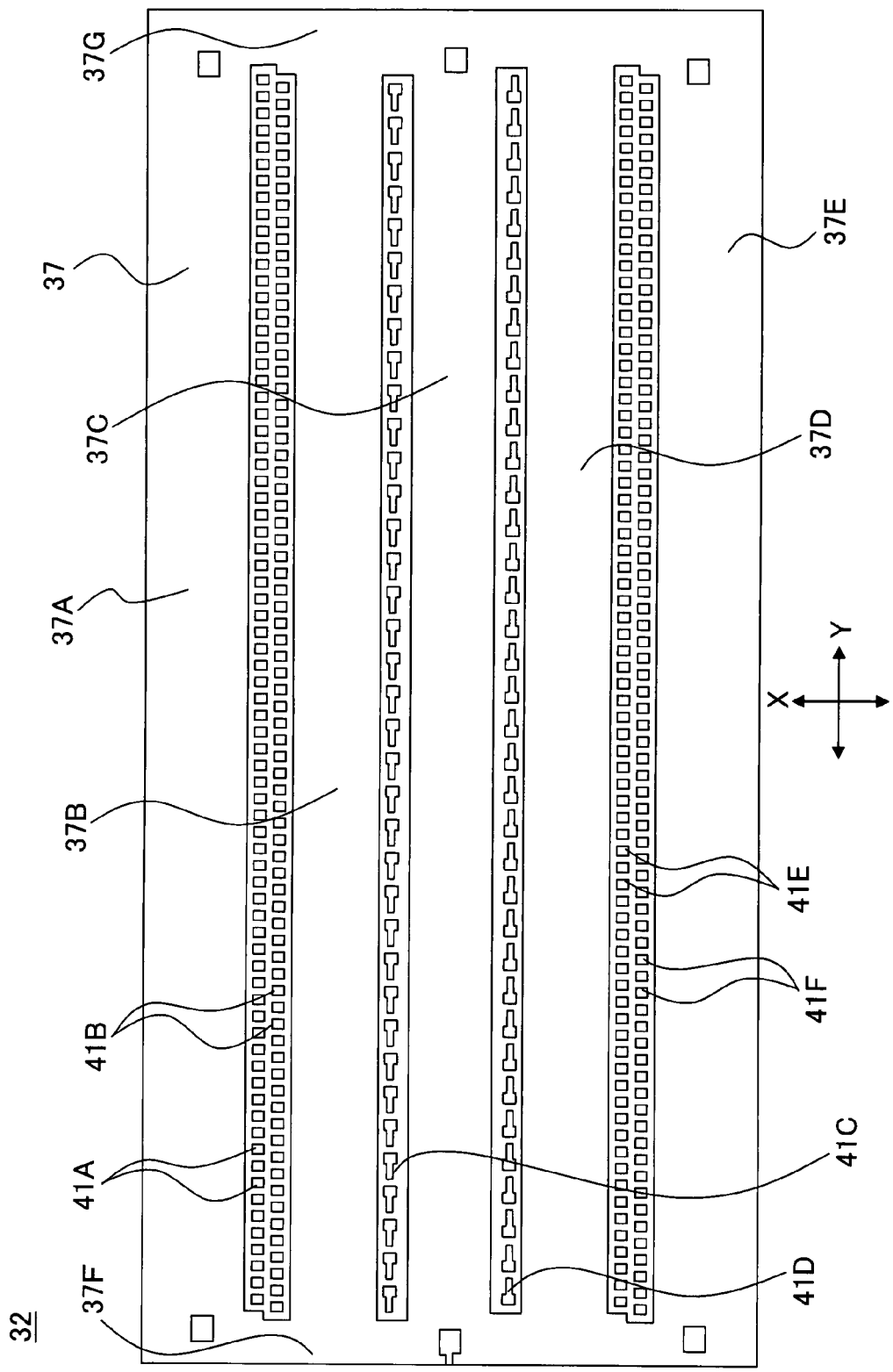
FIG. 6 is a plan view of a second piezoelectric ceramic sheet.

As shown in FIG. 6, the common inner-electrode 37 (second electrode) which is common to the pressure chambers 18a is arranged on a surface of each of the second ceramic sheets 32. The common inner-electrode 37 has five first belt-like portions 37A, 37B, 37C, 37D and 37E which face the individual inner-electrodes 36A, 36B and 36C, arranged in rows in the first ceramic sheet 31, in the stacking direction, and which extend in the row direction of the individual electrodes; and the common inner-electrode 37 has second belt-like portions 37F and 37G which connect the first belt-like portions 37A to 37E at end portions in the longitudinal direction of the second ceramic sheet 32.

Between the first belt-like portions 37A to 37E, the conduction electrodes 41A to 41F are arranged in rows respectively. The conduction electrodes 41A to 41F correspond to the conduction portions 36Ab to 36Fb of the individual inner-electrodes 36A to 36F respectively. Namely, the common inner-electrode 37 surrounds the conduction electrodes 41A to 41F arranged in rows.

Note that the conduction electrodes 41C and 41D located at the central portion on the second ceramic sheet 32 are arranged in rows at a pitch in the row direction twice a pitch at which conduction electrodes 41A, 41B, 41E and 41F located and arranged in rows at both sides of the rows of the conduction electrodes 41C and 41D, respectively. The conduction electrodes 41C and 41D correspond to the individual inner-electrodes 36Ca and 36Cb arranged in rows at the center of the first ceramic sheet 31, respectively.

Figure 7:
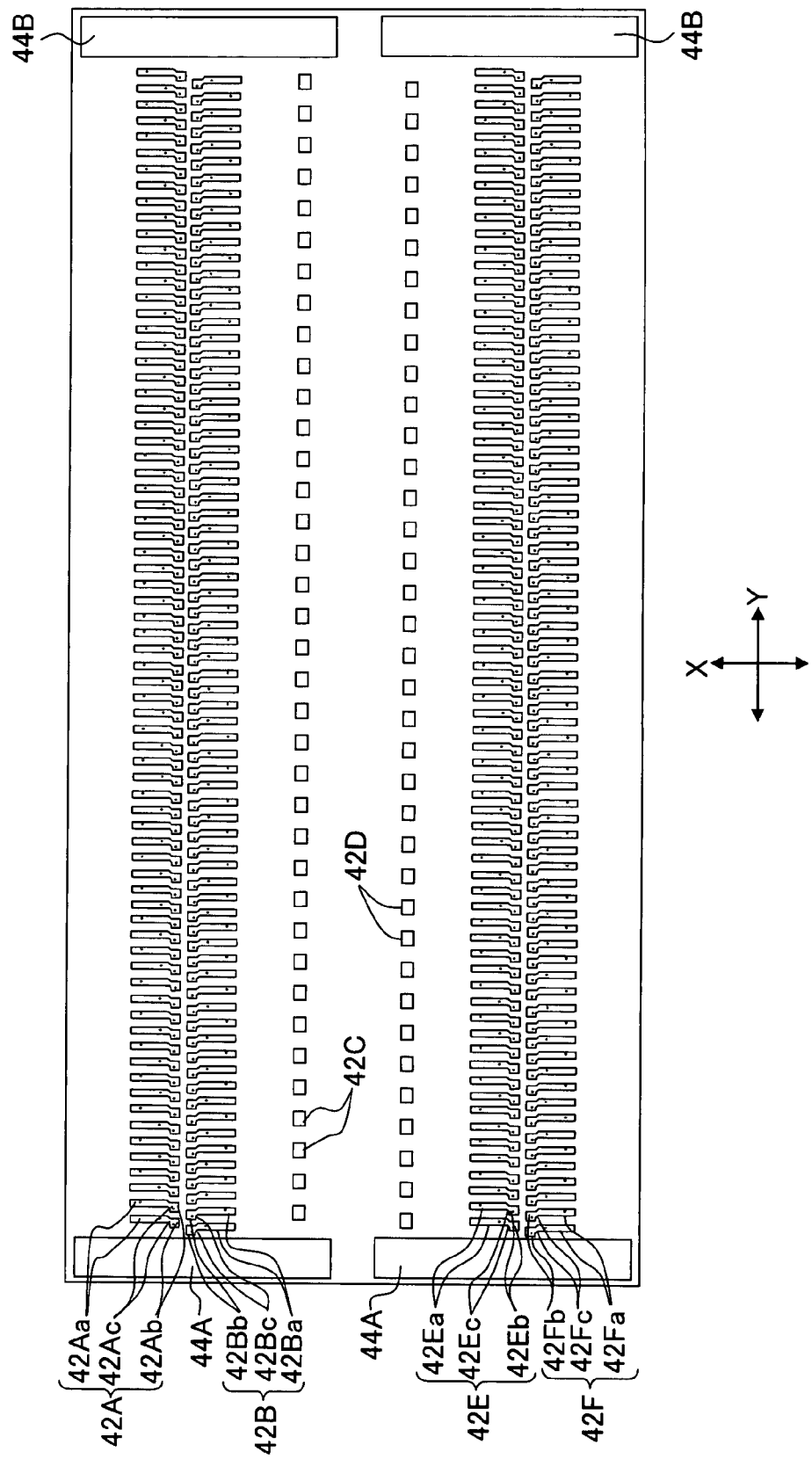
FIG. 7 is a plan view of a dummy ceramic sheet used for electrical conduction (dummy ceramic sheet for adjustment)

As shown in FIG. 7, on a surface of the conduction-dummy ceramic sheet 33, the connection electrodes 42A to 42F are arranged in rows. The connection electrodes 42A to 42F face the individual inner-electrodes 36A to 36E respectively in the stacking direction of the ceramic sheets. The conduction electrodes 41A to 41F are connected to the individual inner-electrodes 36A to 36E and to the individual surface-electrodes 38A to 38E respectively, via inner conduction-electrodes 52A in through holes 53 which will be described later on.

The connection electrodes 42C, 42D located at the center on the conduction-dummy ceramic sheet 33 are arranged in rows at a pitch twice a pitch at which the connection electrodes 42A, 42B, 42E and 42F are arranged in rows at both sides of the rows of the connection electrodes 42C and 42D.

The connection electrodes 42C and 42D correspond to the individual inner-electrodes 36Ca and 36Cb arranged in rows at the center of the first ceramic sheet 31, respectively. In ranges defined by the lengths in the row direction of the conduction electrodes 41A to 41F respectively, the connection electrodes 42C and 42D are arranged to be shifted by half the pitch P (P/2) with respect to the pressure chambers 18a. Namely, the connection electrodes 42C and 42D are arranged above and corresponding to the partition walls 27 between adjacent pressure chambers 18a.

The connection electrodes 42B and 42E, which are arranged outside the connection electrodes 42C and 42D respectively, have linear portions 42Ba and 42Ea (first portions) corresponding to the individual surface-electrodes 38B, 38D, respectively; conduction-portions 42Bb and 42Eb (second portions) arranged to be shifted by half the pitch with respect to the linear portions 42Ba and 42Ea, respectively, in the row-direction of the linear portions 42Ba and 42Ea; and bent portions 42Bc and 42Ec (third portions) connecting the linear portions 42Ba and 42Ea and the conduction portions 42Bb and 42Eb, respectively. The connection electrodes 42A and 42F, which are arranged in rows outside the connection electrodes 42B and 42E respectively, have linear portions 42Aa and 42Fa (first portions) corresponding to the individual surface-electrodes 38A, 38F, respectively; conduction portions 42Ab and 42Fb (second portions) arranged to be shifted by half the pitch with respect to the linear portions 42Aa and 42Fa, respectively, in the row-direction of the linear portions 42Aa and 42Fa; and bent portions 42Ac and 42Fc (third portions) connecting the linear portions 42Aa and 42Fa and the conduction portions 42Ab and 42Fb, respectively.

The linear portions 42Aa, 42Ba, 42Ea and 42Fa extend in an orthogonal direction orthogonal to the row-direction of the connection electrodes 42A, 42B, 42E and 42F respectively. These linear portions are arranged to be shifted in the row direction thereof by half the pitch P (P/2) with respect to the pressure chambers 18a. Namely, these linear portions of the connection electrodes 42C and 42D are each arranged above and corresponding to a partition walls 27 between two adjacent pressure chambers 18a among the pressure chambers 18a.

Further, the conduction portions 42Ab, 42Bb, 42Eb and 42Fb are arranged at positions above extension lines extended from one ends of the pressure chambers 18a in the longitudinal direction thereof, respectively.

Furthermore, the conduction portions 42Ab, 42Bb, 42Eb and 42Fb of the connection electrodes 42A, 42B, 42E and 42F are arranged in the conduction-dummy ceramic sheet 33 so that at least a part of each of the conduction portions 42Ab, 42Bb, 42Eb and 42Fb overlaps in a plan view with one of conduction electrodes 41A, 41B, 41E and 41F arranged in rows in the second ceramic sheets 32 adjacent to the conduction-dummy ceramic sheet 33 in the downward direction; and the connection electrodes 42C and 42D are arranged so that at least a part of each of the connection electrodes 42C and 42D overlaps in a plan view with one of conduction electrodes 41C and 41D arranged in rows in the second ceramic sheets 32 adjacent to the conduction-dummy ceramic sheet 33 in the downward direction. These connection electrodes are arranged so that at least a part the connection electrodes is overlapped in a plan view with one of the conduction portions 36Ab, 36Bb, 36Cbb, 36Cab, 36Db and 36Eb in each of the first ceramic sheet 31, respectively, in a similar manner.

The linear portions 42Aa, 42Ba, 42Ea and 42Fa of the connection electrodes 42A, 42B, 42E and 42F and the connection electrodes 42C and 42D are arranged in the conduction-dummy ceramic sheet 33 so that the linear portions 42Aa, 42Ba, 42Ea and 42Fa of the connection electrodes 42A, 42B, 42E and 42F and the connection electrodes 42C and 42D are parallel to the individual surface-electrodes 38A, 38B, 38D, 38E, 38Ca and 38Cb in the top ceramic sheet 34 located above the linear portions 42Aa, 42Ba, 42Ea and 42Fa of the connection electrodes 42A, 42B, 42E and 42F and the connection electrodes 42C and 42D, respectively; and that at least a part of the linear portions 42Aa, 42Ba, 42Ea and 42Fa of the connection electrodes 42A, 42B, 42E and 42F and the connection electrodes 42C and 42D is overlapped in a plan view with the individual surface-electrodes 38A, 38B, 38D, 38E, 38Ca and 38Cb respectively in the top ceramic sheet 34 located thereabove.

By arranging the connection electrodes as described above, it is possible to separate the linear portions 42Aa, 42Ba, 42Ea and 42Fa which are connected to the individual surface-electrodes 38A, 38B, 38D and 38E via the inner conduction electrodes 52A in the through holes 53A respectively, as will be described later on, and the conduction portions 42Ab, 42Bb, 42Eb and 42Fb which are connected to the individual inner-electrodes 36A, 36B, 36D and 36E via the inner conduction electrodes 52A in the through holes 53A respectively, as will be described later on. Accordingly, in the connection electrodes 42A to 42F which do not contribute to the displacement, it is possible to absorb the shift by half the pitch between the individual surface-electrodes 38A to 38E and the individual inner-electrodes 36A to 36E, respectively.

On the upper surface of the conduction-dummy ceramic sheet 33, conduction electrodes 44A, 44B for the common inner-electrode (common-conduction electrodes 44A, 44B) are formed at positions along the short sides of the conduction-dummy ceramic sheet 33 respectively, namely at both end portions in the row direction of the conduction electrodes 42A to 42F. The common-conduction electrodes 44A, 44B are elongated in a direction orthogonal to the row direction of the conduction electrodes 42A to 42F, and are formed at positions at which the common-conduction electrodes 44A and 44B overlap with a part of the common inner-electrode 37 (belt-like portions 37F, 37G) in each of the second ceramic sheets 32 and overlap with a part of the dummy common electrode 43 in each of the first ceramic sheets 31.

Figure 8:
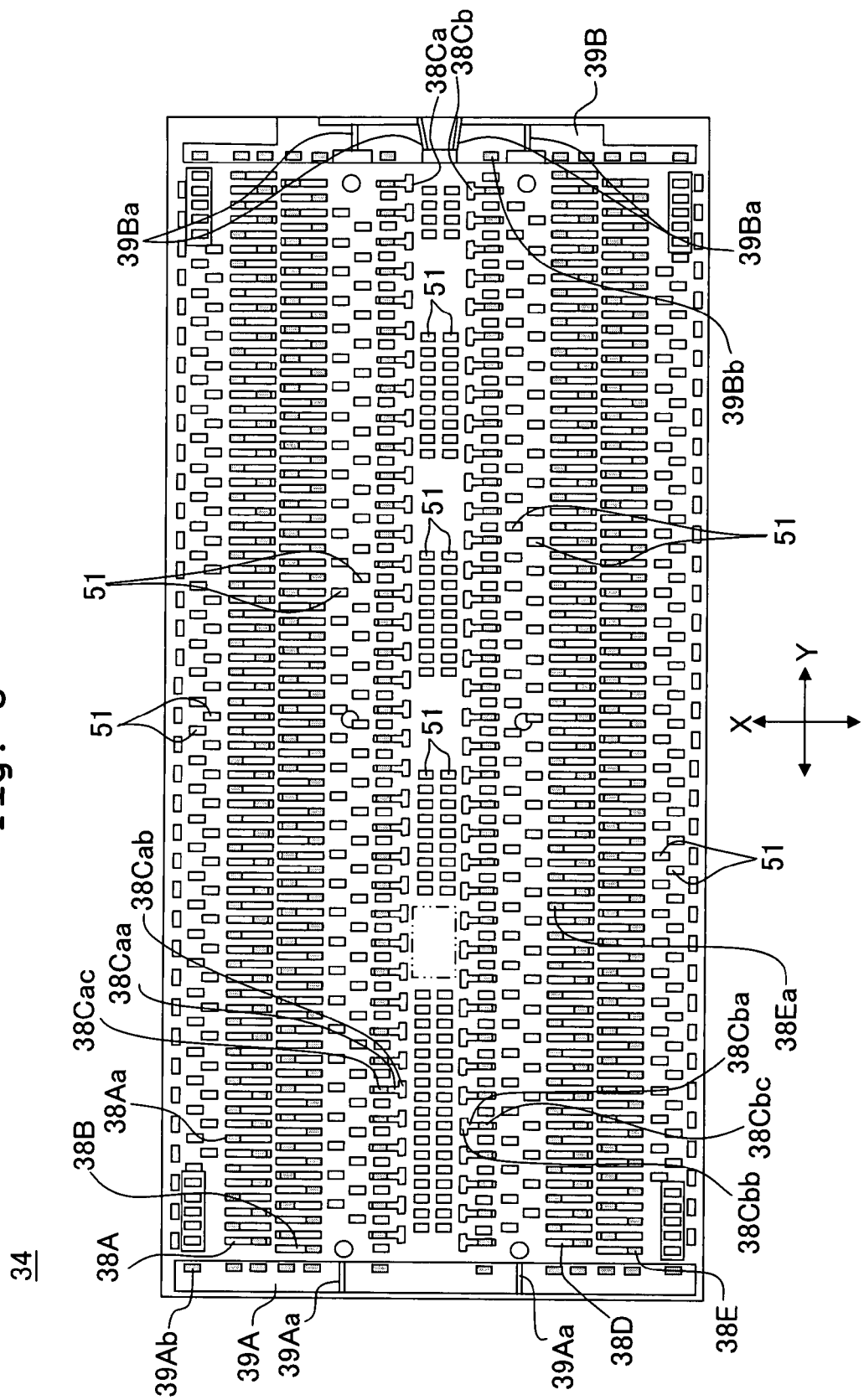
FIG. 8 is a plan view of a top ceramic sheet.

As shown in FIG. 8, on a surface of the top ceramic sheet 34, individual surface-electrodes 38A, 38B, 38Ca, 38Cb, 38D, 38E (first surface electrodes) are arranged in rows at positions corresponding to the conduction electrodes 42A to 42F of the dummy ceramic sheet 33 respectively. On the surface of the top ceramic sheet 34, common surface-electrodes 39A, 39B (second surface electrodes) are formed at both end portions in the row direction of the individual surface-electrodes 38A to 38E. The common surface-electrodes 39A and 39B are formed to be elongated in a direction orthogonal to the row direction of the individual surface-electrodes 38A to 38E.

The individual surface-electrodes 38Ca, 38Cb located at the center on the top ceramic sheet 34 are formed in a T-shape (form of the alphabet letter "T") in a plan view, having first portions 38Caa, 38Cba extending in the X-direction and second portions 38Cab, 38Cbb connected to the inner end portions of the first portions 38Caa, 38Cba and extending in the Y-direction. The individual surface-electrodes 38Ca, 38Cb are arranged in two rows in a staggered manner such that the individual surface-electrodes 38Ca aligned in one row are shifted by half a pitch with respect to that for the individual surface-electrodes 38Cb aligned in the other row. As indicated as hatched portions in FIG. 8, joining electrode portions 38Cac, 38Cbc are formed on end portions of the second portions 38Cab, 38Cbb, respectively. The joining electrode portions 38Cac, 38Cbc are connected to connection terminals of the flexible flat cable 4 which will be described later on.

The individual surface-electrodes 38A, 38B, 38D and 38E located outside of the individual surface-electrodes 38Ca, 38Cb have a linear shape in a plan view, and are arranged in a staggered manner such that individual surface-electrodes belonging to a certain row is shifted from individual surface-electrodes belonging to another row adjacent to the certain row by half a pitch at which the individual surface-electrodes are aligned in each of the rows. As indicated as hatched portions in FIG. 8, joining electrode portions 38Aa, 38Ba, 38Da and 38Ea are formed on end portions of the individual surface-electrodes 38A, 38B, 38D and 38E, respectively. The joining electrode portions 38Aa, 38Ba, 38Da and 38Ea are connected to connection terminals of the flexible flat cable 4 which will be described later on. Here, each of these joining electrode portions is formed at any one of the both end portions of the individual surface-electrode, so that the joining electrode portions are located alternately at both ends in the row direction of the individual surface-electrodes.

The individual surface-electrodes 38A to 38E are arranged at positions above the partition walls 27 (see FIG. 3) each of which is arranged between mutually adjacent pressure chambers 18a among the pressure chambers 18a. Here, the pressure chambers 18a are substantially parallel to the linear portion 36Aa to 36Ea of the individual inner-electrodes 36A to 36E respectively, and are arranged at positions below the linear portions 36Aa to 36Ea respectively. Therefore, the individual inner-electrodes 36A to 36E are arranged in rows at a pitch same as the pitch P for arranging the pressure chambers 18a in rows in the Y-direction, and the individual surface-electrodes 38A to 38E are arranged to overlap in a plan view with the pressure chambers 18a respectively. On the other hand, although the individual surface-electrodes 38A to 38E and the pressure chambers 18a are arranged in rows at a same pitch, the individual surface-electrodes 38A to 38E and the pressure chambers 18a are arranged to be mutually shifted by half the pitch. Accordingly, when the individual surface-electrodes 38A to 38E are connected to the connection terminals of the flexible flat cable 4, it is possible to receive by the partition walls 27a the pressing force generated during the connection. Thus, there is no fear that the ceramic sheet or sheets are broken or damaged.

Each of the common surface-electrodes 39A, 39B is formed on the top ceramic sheet 34 to be elongated along one of the short sides thereof of the top ceramic sheet 34. Further, as indicated by hatched portions in FIG. 8, a plurality of joining electrode portions 39Ab and a plurality of joining electrode portions 39Bb are formed, on surfaces of the common surface-electrodes 39A and 39B, respectively, along the longitudinal direction of the common surface-electrodes 39A and 39B. The joining-electrode portions 39Ab and 39Bb are connected to connection terminals of the flexible flat cable 4.

When the piezoelectric actuator is calcinated as described above, the surface electrodes (individual surface-electrodes and the common surface-electrodes) are also processed at a high temperature, which in turns lowers the joining performance of solder joining the surface electrodes and the connection terminals of the flexible flat cable 4. Therefore, the joining electrode portions 38Aa, 38Ba, 38Cac, 38Cbc, 38Da, 38Ea, 39Ab, 39Bb formed of a silver-based metal are adhered onto the surface electrodes formed of Ag—Pd based metal to thereby improve the joining performance between the surface electrodes and the connection terminals of the flexible flat cable 4.

A plurality of dummy electrodes 51, which do not contribute to the electrical conduction, are provided in a regular manner between the rows of the individual surface-electrodes 38Ca and 38Cb. The dummy electrodes 51 are also arranged on the top ceramic sheet 34 at a portion between the individual surface-electrodes 38B and 38Ca; at a portion between the individual surface-electrodes 38Cb and 38D; and at portions outside the individual surface-electrodes 38A and 38E respectively.

The arrangement of the dummy electrodes 51 is not limited to that shown in FIG. 8. It is enough that the dummy electrodes 51 described above are arranged in a balanced manner at positions at which the surface electrodes are arranged respectively, so as to prevent the joining force from lowering when the respective sheets are pressed to be integrated.

As shown in FIG. 4, a common inner-electrode 71 is formed entirely on the upper surface of the bottom ceramic sheet 35.

Figure 10A:
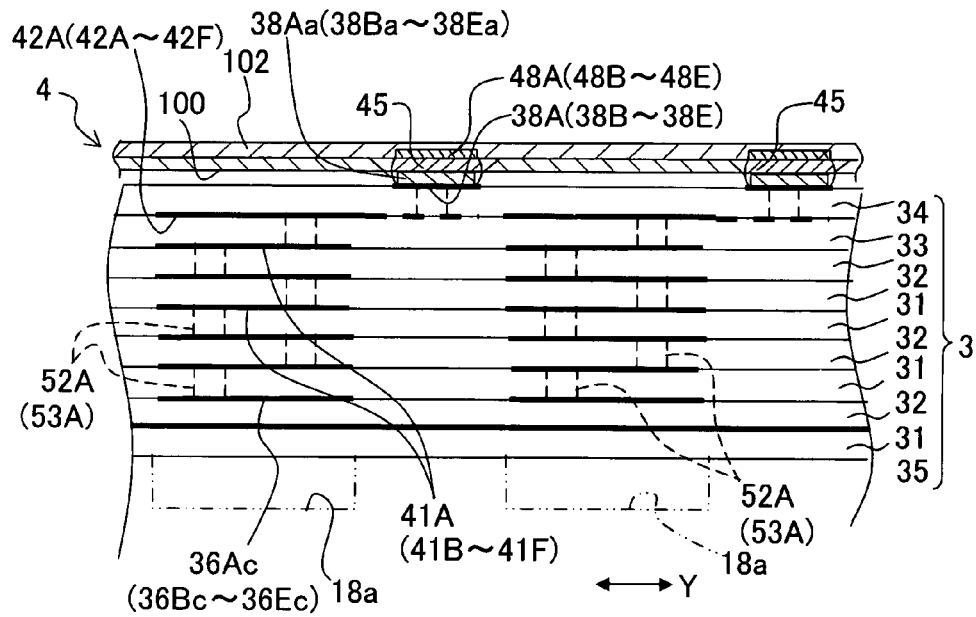
FIG. 10A is a sectional view for explaining the conduction relationship from individual inner-electrodes to individual surface-electrodes.
Figure 10B:
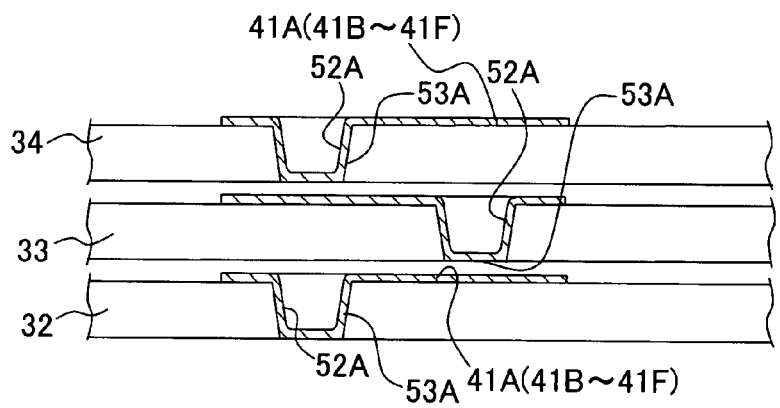
FIG. 10B is a view for explaining through holes.
Figure 10C:
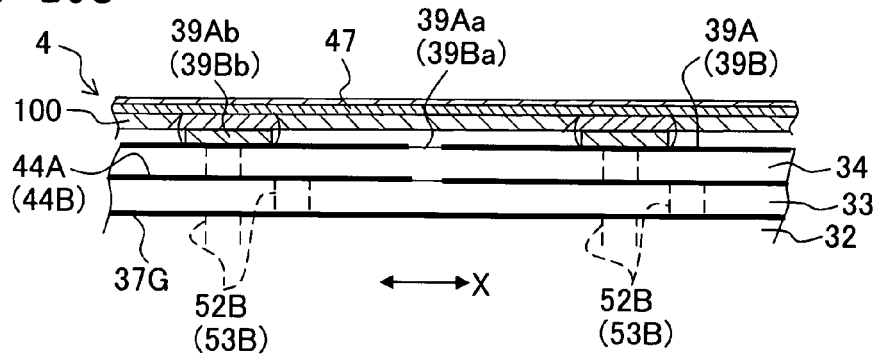
FIG. 10C is a sectional view for explaining the conduction relationship from common electrodes to surface electrodes.

Other than the bottom ceramic sheet 35 as the lowermost layer in the actuator, the first and second ceramic sheets 31 and 32, the conduction-dummy sheet 33, and the top ceramic sheet 34 are provided with a plurality of through holes 53A, as shown in FIGS. 10 and 10B. The through holes 53A penetrate through the sheets 31 to 34 in the thickness direction thereof, and an electrically conductive paste is filled in the inside of the through holes 53A to form inner electrodes 52A therein respectively.

Namely, the plurality of through holes 53A penetrating through the ceramic sheets 31 to 34 are formed in the individual surface-electrodes 38A to 38E, the conduction portions 36Ab to 36Eb of the individual inner-electrodes 36A to 36E, the conduction electrodes 41A to 41F and the connection electrodes 42A to 42F, respectively. Inside the through holes 53A, an electrically conductive material (electrically conductive paste) is filled to form inner conduction electrodes 52A. These inner conduction electrodes 52A electrically connect the individual surface-electrodes 38A to 38E, the conduction portions 36Ab to 36Eb of the individual inner-electrodes 36A to 36E, the conduction electrodes 41A to 41F and the connection electrodes 42A to 42F in the up and down direction, respectively. The linear portions 42Aa, 42Ba, 42Ea and 42Fa of the connection electrodes 42A, 42B, 42E and 42F are connected to the individual surface-electrodes 38A, 38B, 38D and 38E via the inner conduction electrodes 52A inside the through holes 53A formed in the conduction portions 42Ab, 42Bb, 42Eb and 42Fb and in the individual surface-electrodes 38A, 38B, 38D and 38E.

Furthermore, a plurality of through holes 53B penetrating through the piezoelectric ceramic sheets 31 to 34 in the thickness direction thereof are formed at positions corresponding to the electrodes 39A, 39B, 37, 71, 43, 44A and 44B respectively. Inside the through holes 53B, an electrically conductive material (electrically conductive paste) is filled to form inner conduction electrodes 52B.

Figure 11:
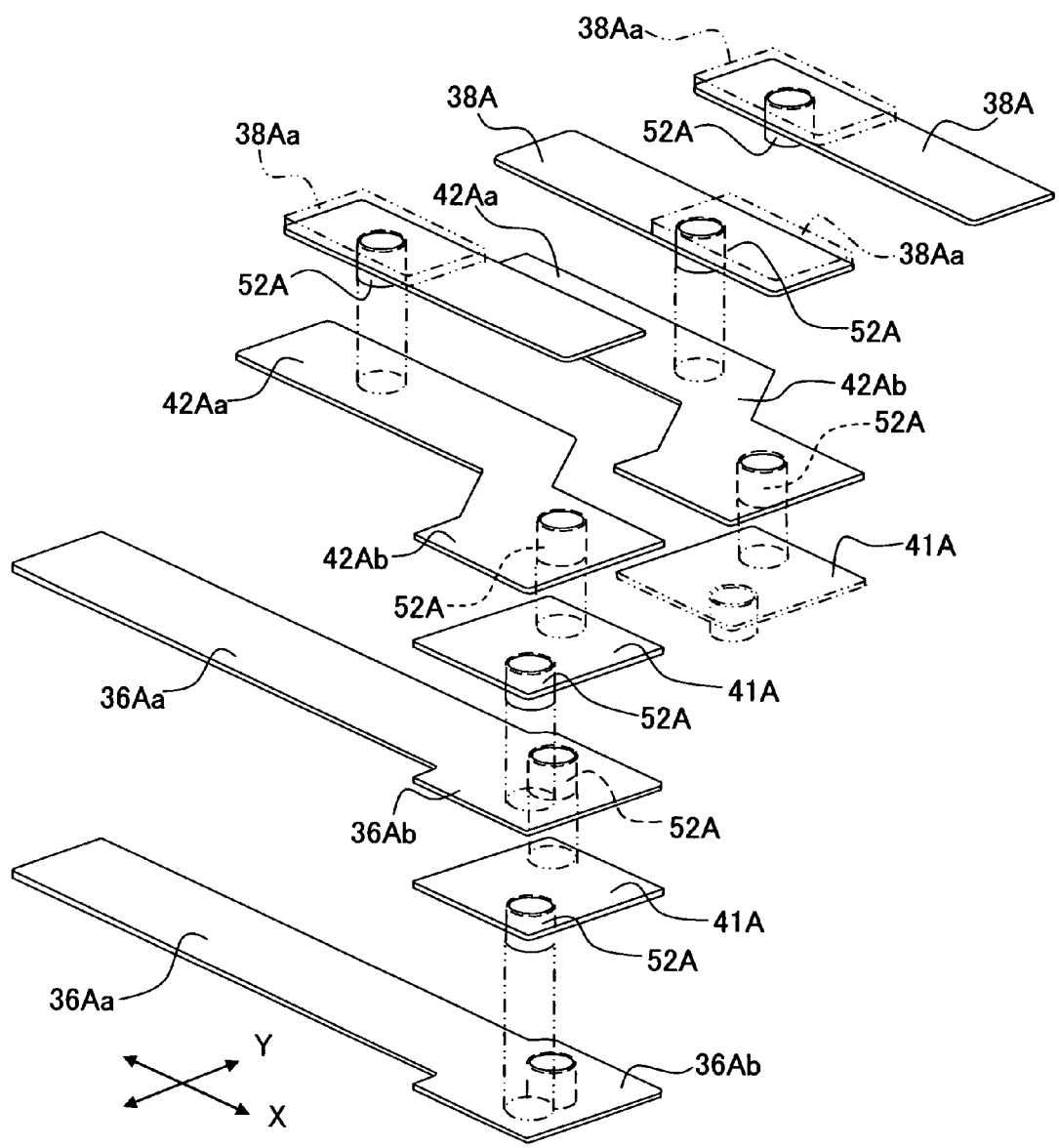
FIG. 11 is a perspective view for explaining the conduction relationship from the individual inner-electrodes to the individual surface-electrodes.

The inner conduction electrodes 52A and the inner conduction electrodes 52B are formed in the ceramic sheets such that positions, at which the inner conduction electrodes 52A and 52B formed in a certain ceramic sheet respectively, do not overlap in a plan view with positions at which the inner conduction electrodes 52A and 52B formed in another certain ceramic sheets adjacent to the certain ceramic sheet (sandwiching the certain ceramic sheet) in the up and down direction. As shown in FIGS. 10B and 11, the through holes 53A, 53B are formed in the conduction dummy sheet 33 at positions which are shifted by a predetermined distance from positions at which the through holes 53A, 53B are formed in the top ceramic sheet 34. The through holes 53A, 53B are formed in the green sheets as the material for the ceramic sheets, and then the conductive material is coated on surfaces of the green sheets by the screen printing or the like. At this time, the conductive material is flowed into the through holes 53A, 53B to form the inner conductive electrodes 52A, 52B respectively. Therefore, as shown in FIG. 10B, each of the inner conductive electrodes 52A, 53B is formed in a hollow shape opening on the side of the upper surface of the green sheet. Since the through holes are formed such that the through holes formed in two layers of the ceramic sheets adjacent in the up and down direction are located at positions which do not overlap with one another. Therefore, it is possible to avoid a situation in which through holes formed in the upper layer sheet are coaxially overlapped with through holes formed in the lower layer sheet, which would otherwise decrease contacting areas for the inner conduction electrodes 52A, 52B. Namely, by forming two adjacent through holes 53A in the up and down direction to be shifted from each other, it is possible to make the bottom portions of the inner conduction electrodes 52A, 52B, formed to have a cup-shape in the upper layer sheet to have a surface-to-surface contact with the flat-shaped electrodes 42A (41A) formed on the lower layer sheet, thereby ensuring the electric conduction between the upper and lower layer sheets.

The individual surface-electrodes 38A, 38B, 38D and 38E and the connection electrodes 42A, 42B, 42D and 42E are elongated in a direction orthogonal to the row direction, and face one another in the stacking direction. Further, the individual surface-electrodes 38A, 38B, 38D and 38E are connected to the connection electrodes 42A, 42B, 42D and 42E respectively such that a certain one of the individual surface-electrodes 38A, 38B, 38D and 38E is connected to one of the connection electrodes 42A, 42B, 42D and 42E corresponding thereto at a position different from another position at which another one of the individual surface-electrodes 38A, 38B, 38D and 38E, adjacent to the certain one electrode in the direction orthogonal to the row direction, is connected to another one of the connection electrodes 42A, 42B, 42D and 42E corresponding thereto. Specifically, as shown in FIG. 11, a certain individual surface-electrode 38A and a linear potion 42Aa of a certain connection electrode 42A corresponding to the certain individual surface-electrode 38A are connected to each other at one ends in the longitudinal direction of the certain individual surface-electrode and the linear potions 42Aa by the inner conduction-electrode 52A in the through hole. On the other hand, another individual surface-electrode 38A adjacent to the certain individual surface-electrode 38A and a linear potion 42Aa of another connection electrode 42A corresponding to the another individual surface-electrode 38A are connected to each other at other ends in the longitudinal direction of the another individual surface-electrode and the linear potions 42Aa by the inner conduction-electrode 52A in the through hole. Namely, in the row direction, the individual surface-electrodes and the connection electrodes are connected to each other alternately at both ends of individual surface-electrodes in a staggered manner. Since the two individual surface-electrodes are connected to each other at mutually different positions, it is possible to arrange a large number of through holes in a dispersed (non-concentrated manner), without arranging the large number of through holes adjacently in the row direction. Accordingly, when the ceramic sheets are calcinated, it is possible to suppress the arching deformation or warpage of the ceramic sheets with the through holes as the base point of the arching deformation.

Figure 9:
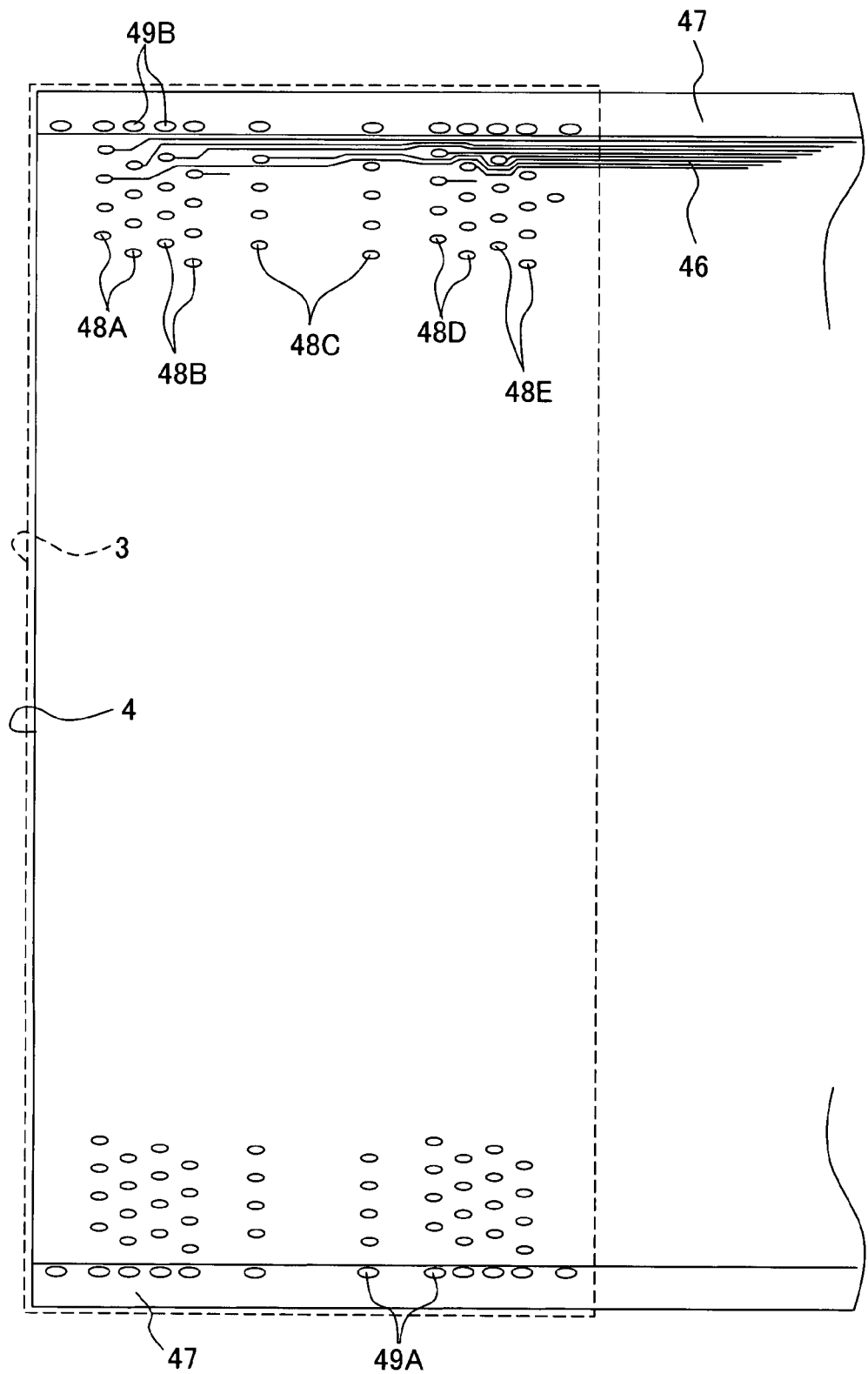
FIG. 9 is a plan view for explaining electrode arrangement in the flexible flat cable.

As shown in FIG. 1, the flexible flat cable 4 is overlaid with the upper surface of the top ceramic sheet 34 and arranged to be project outwardly from the top ceramic sheet 34 in a direction orthogonal to the nozzle rows (X-direction). The flexible flat cable 4 includes a belt-like shaped base member 100 made of flexible synthetic resin material having insulating property (for example, polyimide resin, polyester resin, polyamide resin, or the like); connection terminals 48A, 48B, 48C, 48D and 48E which are made of copper foil and which are formed on a surface of the base member 100 to correspond to the joining electrode portions 38Aa to 38Ea for the individual inner-electrodes respectively; and fine wirings 46 connected to the connection terminals 48A to 48E. Further, as shown in FIG. 9, connection terminals 49A, 49B are formed in the flexible flat cable 4 at positions overlapping with (corresponding to) the joining electrode portions 39Ab, 39Bb of the common inner-electrodes respectively; and wirings 47 which are connected to the connection terminals 49A, 49B respectively are provided on the flexible flat cable 4 along the both ends of the flexible flat cable 4. The wirings 47 are belt-like shaped and have a width greater than that of the wirings 46. These connection terminals and wirings are formed by the photoresist method or the like, and as shown in FIG. 10A, the surfaces of these terminals and wirings are covered by a cover lay 102 made of a flexible synthetic resin material having insulating property (for example, polyimide resin, polyester resin, polyamide resin, or the like).

The connection terminals 48A to 48E, 49A and 49B are exposed from the base member 100, and are joined to the joining electrode portions 38Aa to 38Ea, 39Ab and 39Bb for the individual inner-electrodes and the common inner-electrodes, respectively, with an electrically conductive brazing material (for example, solder) 45. Further, the wirings 47 are electrically joined to a driving integrated circuit 101 provided on the base member 101, thereby making it possible to selectively supply driving signals to the piezoelectric actuator.

The connection terminals 48A to 48E are arranged in rows corresponding to the joining electrode portions 38Aa to 38Ea for the individual inner-electrodes respectively, such that connection terminals are arranged in a staggered manner in each connection terminal row, and that a certain connection terminal in a certain row is arranged to be staggered with respect to another connection terminal in another row adjacent to the certain row. Therefore, it is possible to make the spacing distance great between the adjacent terminals 48A to 48E, and to draw the wirings 46 between the spacing distance among the rows such that the wirings 46 are not interfered with each other.

Portions of the ceramic sheets 31 and 32, between the individual inner-electrodes 36A to 36E and the common electrodes 37, 71 in the stacking direction of the ceramic sheets, function as active portions (energy generating mechanism). Namely, when the voltage is applied to portions (active portions) of the ceramic sheets between certain individual inner-electrodes 36A to 36E and the common electrodes 37, 71, the active portions to which the voltage is applied are displaced to impart deformation (displacement) due to the vertical piezoelectric effect. The active portions (energy generating mechanism) are provided in a one-to-one correspondence to the pressure chambers 18a, and the active portions are formed at positions at which the active portions overlap with the pressure chambers 18a respectively.

Namely, the active portions are arranged in the row direction of the nozzles 11a (pressure chambers 18a), i.e. in the Y-direction, and are aligned in the X-direction in rows in a number same as that of the rows of the nozzles 11a (five rows in the embodiment). Further, the active portions are each formed to be elongated in the longitudinal direction of the pressure chamber 18a. The active portions are arranged in a staggered manner at spacing distances (intervals) same as those for the pressure chambers 18a.

In the above-described embodiment, the number of the individual inner-electrodes and the number of the individual surface-electrodes may be set in any manner provided that the numbers each corresponds to the number of the pressure chambers.

What is claimed is:

1. A piezoelectric actuator which is joined to a cavity unit having a plurality of nozzles each of which jets a liquid-droplet of a liquid and a plurality of pressure chambers which correspond to the nozzles respectively and which are arranged in a row at a predetermined pitch in a predetermined row-direction, the piezoelectric actuator comprising:
    a plurality of ceramic sheets stacked in a predetermined stacking direction;
    a plurality of individual inner-electrodes which correspond to the pressure chambers respectively, and which are arranged in a row between the ceramic sheets;
    a common inner-electrode which is common to the pressure chambers, and which is arranged to face the individual inner-electrodes so that the ceramic sheets are sandwiched between the common inner-electrode and the individual inner-electrodes;
    a plurality of individual surface-electrodes arranged on a top surface, of the stacked ceramic sheets, opposite to the cavity unit, each of the individual surface-electrodes being arranged in the row-direction to be shifted with respect to one of the pressure chambers by half the predetermined pitch;
    a common surface-electrode which is formed on the top surface of the stacked ceramic sheets, and which is connected to the common inner-electrode; and
    a plurality of connection electrodes which are arranged on a ceramic sheet, of the ceramic sheets, between the individual surface-electrodes and the individual inner-electrodes, and which connect the individual surface-electrodes and the individual inner-electrodes respectively;
    wherein the connection electrodes include first portions, second portions, and third portions respectively;
    wherein each of the first portions face one of the individual surface-electrodes in the stacking direction and are connected to one of the individual surface-electrodes;
    wherein each of the second portions face one of the individual inner-electrodes in the stacking direction, are connected to one of the individual inner-electrodes, and are arranged in the row-direction to be shifted with respect to one of the first portions by half the pitch; and
    wherein the third portions connect the first portions and the second portions respectively.

2. The piezoelectric actuator according to claim 1;
    wherein terminals of signal lines, via which a driving signal is inputted, are connected to the individual surface-electrodes and the common surface-electrode.

3. The piezoelectric actuator according to claim 2;
    wherein the plurality of ceramic sheets include a first ceramic sheet on which the individual inner-electrodes are formed, a second ceramic sheet on which the common inner-electrode is formed, a third ceramic sheet on which the individual surface-electrodes and the common surface-electrode are formed, and a fourth ceramic sheet on which the connection electrodes are formed;
    wherein through holes are formed in each of the ceramic sheets at areas sandwiched between the individual inner-electrodes and the second portions of the connection electrodes respectively and at another areas sandwiched between the individual surface-electrodes and the first portions of the connection electrodes respectively; and
    wherein an electrically conducted material filled in the through holes connects between the individual inner-electrodes and the second portions of the connection electrodes and between the individual surface-electrodes and the first portions of the connection electrodes respectively.

4. The piezoelectric actuator according to claim 2;
    wherein the first portions of the connection electrodes extend in an orthogonal direction which is orthogonal to the row-direction;
    wherein some of the first portions mutually adjacent in the row-direction are connected to the individual surface-electrodes at connection positions which are mutually different in the orthogonal direction; and
    wherein the individual surface-electrodes are connected to the terminals of the signal lines at positions overlapping with the connection positions respectively.

5. The piezoelectric actuator according to Claim 4;
    wherein the individual surface-electrodes are arranged in a row and in a parallel direction which is parallel to the row-direction and extend in the orthogonal direction; and
    wherein joining electrodes are formed in the individual surface-electrodes respectively at positions each overlapping with one of the connection positions, the joining electrode being connected to the terminals of the signal lines respectively.

6. The piezoelectric actuator according to claim 2;
    wherein the pressure chambers are arranged in a plurality of rows in the cavity unit;
    wherein the individual inner-electrodes are arranged in a plurality of rows corresponding to the rows of the pressure chambers respectively;
    wherein the common inner-electrode faces the individual inner-electrodes in the stacking direction and extends in the row-direction;
    wherein the connection electrodes are arranged in a plurality of rows and the individual surface-electrodes are arranged in a plurality of rows corresponding to the rows of the individual inner-electrodes; and
    wherein the common surface-electrode extends, in a same plane with the individual surface-electrodes, along an end portion of the third ceramic sheet which is orthogonal to the row-direction.

7. The piezoelectric actuator according to claim 2;
    wherein a plurality of first through holes and a plurality of second through holes are formed in each of the first ceramic sheet and the second ceramic sheet;
    wherein the first through holes and the second through holes are formed at positions mutually different in a plane orthogonal to the stacking direction; and
    wherein an electrically conductive material is filled in each of the first and second through holes.

8. A liquid-droplet jetting head which jets a liquid-droplet of a liquid, comprising:
    a cavity unit having a plurality of nozzles each of which jets the liquid-droplet, and a plurality of pressure chambers which correspond to the nozzles respectively and which are arranged in a row at a predetermined pitch in a predetermined row-direction ; and
    a piezoelectric actuator which is joined to the cavity unit, the piezoelectric actuator including:
        a first ceramic sheet on which a plurality of individual inner-electrodes are arranged in a row corresponding to the pressure chambers respectively;
        a second ceramic sheet which is stacked on the first ceramic sheet and on which a common inner-electrode is formed, the common inner-electrode being common to the pressure chambers and facing the individual inner-electrodes;

a third ceramic sheet which is stacked on an outermost layer of the stacked first and second ceramic sheets, and on which a plurality of individual surface-electrodes and a common surface-electrode are formed, each of the individual surface-electrodes being arranged in the row-direction to be shifted with respect to one of the pressure chambers by half the predetermined pitch and being connected to one of the individual inner-electrods, and the common surface-electrode being connected to the common inner-electrode; and a fourth ceramic sheet which is arranged between the third and first ceramic sheets and on which a plurality of connecting electrodes are formed;

wherein the connection electrodes include first portions, second portions, and third portions respectively;

wherein each of the first portions faces one of the individual surface-electrodes in the stacking direction and is connected to one of the individual surface-electrodes;

wherein each of the second portions faces one of the individual inner-electrodes in the stacking direction, is connected to one of the individual inner-electrodes, and is arranged in the row-direction to be shifted with respect to one of the first portions by half the pitch; and wherein the third portions connect the first portions and the second portions respectively.

9. The liquid-droplet jetting head according to claim 8, further comprising:

terminals connected to the individual surface-electrodes and the common surface-electrode;

wherein the piezoelectric actuator is provided with signal lines transmitting a driving signal for driving the piezoelectric actuator to the piezoelectric actuator.

10. The liquid-droplet jetting head according to claim 8;

wherein through holes are formed in each of the first, second, third, and fourth ceramic sheets, at areas sandwiched between the individual inner-electrodes and the second portions of the connection electrodes respectively and at other areas sandwiched between the individual surface-electrodes and the first portions of the connection electrodes respectively; and wherein an electrically conductive material filled in the through holes connects between the individual inner-electrodes and the second portions of the connection electrodes and connects between the individual surface-electrodes and the first portions of the connection electrodes respectively.

11. The liquid-droplet jetting head according to claim 9;

wherein the first portions of the connection electrodes extend in an orthogonal direction which is orthogonal to the row-direction;

wherein some of the first portions mutually adjacent in the row-direction are connected to the individual surface-electrodes at connection positions which are mutually different in the orthogonal direction; and wherein the individual surface-electrodes are connected to the terminals of the signal lines at positions overlapping with the connection positions respectively.

12. The liquid-droplet jetting head according to claim11;

the individual surface-electrodes are arranged in a row and in a parallel direction which is parallel to the row-direction, and extend in the orthogonal direction; and wherein joining electrodes are formed in the individual surface-electrodes respectively at positions each overlapping with one of the connection positions, the joining electrode being connected to the terminals of the signal lines respectively.

13. The liquid-droplet jetting head according to claim 9;

wherein the pressure chambers are arranged in a plurality of rows in the cavity unit;

wherein the individual inner-electrodes are arranged in a plurality of rows corresponding to the rows of the pressure chambers respectively;

wherein the common inner-electrode faces the individual inner-electrodes in the stacking direction and extends in the row-direction;

wherein the connection electrodes are arranged in a plurality of rows and the individual surface-electrodes are arranged in a plurality of rows corresponding to the rows of the individual inner-electrodes; and wherein the common surface-electrode extends, in a same plane with the individual surface-electrodes, along an end portion of the third ceramic sheet which is orthogonal to the row-direction.

14. The liquid-droplet jetting head according to claim 9;

wherein a plurality of first through holes and a plurality of second through holes are formed in each of the first ceramic sheet and the second ceramic sheet;

wherein the first through holes and the second through holes are formed at positions mutually different in a plane orthogonal to the stacking direction; and wherein the electrically conductive material is filled in each of the first and second through holes.

* * * * *